(12) United States Patent
Nishihara et al.

(10) Patent No.: US 7,050,347 B2
(45) Date of Patent: May 23, 2006

(54) SEMICONDUCTOR MEMORY

(75) Inventors: Ryuji Nishihara, Osaka (JP); Masashi Agata, Osaka (JP); Toshiaki Kawasaki, Osaka (JP); Masanori Shirahama, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/038,025

(22) Filed: Jan. 21, 2005

(65) Prior Publication Data

US 2005/0162954 A1 Jul. 28, 2005

(30) Foreign Application Priority Data

Jan. 26, 2004 (JP) ............................. 2004-016880

(51) Int. Cl.
*G11C 7/02* (2006.01)
(52) U.S. Cl. ...................... 365/207; 365/208; 365/201; 365/189.08
(58) Field of Classification Search ................ 365/207, 365/208, 201, 189.08
See application file for complete search history.

(56) References Cited

U.S. PATENT DOCUMENTS

| 4,970,691 A | 11/1990 | Atsumi et al. |
| 6,434,068 B1 * | 8/2002 | Harada et al. ............... 365/201 |
| 2005/0052926 A1 * | 3/2005 | Agata et al. ................ 365/222 |

FOREIGN PATENT DOCUMENTS

JP 3-120759 5/1991

* cited by examiner

*Primary Examiner*—Richard Elms
*Assistant Examiner*—Toan Le
(74) *Attorney, Agent, or Firm*—McDermott Will & Emery LLP

(57) ABSTRACT

In a normal operation, an output of a differential amplifier for amplifying a difference between first and second bit cells is output as readout data. In a test mode, when a first control signal is set to be "H", the output of the differential amplifier is fixed to be "H" and thus an output of the first bit cell is read out through gates.

9 Claims, 3 Drawing Sheets

SEMICONDUCTOR MEMORY

CROSS-REFERENCE TO RELATED APPLICATION

This application claims priority under 35 U.S.C. §119(a) on Japanese Patent Application No. 2004-16880 filed on Jan. 26, 2004, the entire contents of which are hereby incorporated by reference.

BACKGROUND OF THE INVENTION

The present invention relates to a semiconductor memory including a so-called "differential-type cell" with two bit cells for storing opposite logic states to each other, respectively, for amplifying a difference between data stored in one of the bit cells and data stored in the other and outputting the amplified difference as readout data.

Recently, with reduction in the size of fabrication processes, the thickness of transistor oxide films has been reduced more and more. Because of this, in a known memory cell, a leakage voltage and the like are generated in a gate oxide film of an MOS transistor and, due to the leakage voltage and the like, data holding properties are deteriorated. In a data determination method in which data determination is performed by comparing a voltage stored in a memory cell to a threshold voltage, it is difficult to suppress reduction in reliability resulting from the reduction in the size of fabrication processes.

To cope with this problem, a so-called "differential-type cell" including two bit cells and a differential amplifier has been already devised (see Japanese Laid-Open Publication No. 3-120759). In a data write operation, different data indicating opposite logic states to each other are stored in the two bit cells, respectively, for example, according to the levels of respective threshold voltages of the bit cells. On the other hand, in a readout operation, the differential amplifier reads respective potentials of the two bit cells and a difference between the potentials is amplified and then output as readout data.

The differential-type cell is less influenced by a leakage of electric charges, compared to the data determination method in which data determination is performed by comparing a stored voltage in a memory cell to a threshold, so that a large noise margin can be provided. Therefore, a semiconductor memory with excellent data holding properties can be achieved.

SUMMARY OF THE INVENTION

However, with a known configuration, the following problems arise.

The differential-type cell has a configuration in which respective potentials of two bit cells are compared to each other and a difference between the potentials is amplified. Thus, even if a difference between two potentials is very small, the potential difference is amplified by a differential amplifier and then data is output. Therefore, for example, in a bench test before shipment, a pass/fail test for data output is performed, but the pass/fail judgment is conducted only for readout data obtained by amplifying a difference and thus properties are not evaluated for each of the two bit cells.

Accordingly, in the known configuration, when a memory cell, which is finally mounted on a system LSI, is shipped, it can not be evaluated how much margin is obtained for the actual threshold of the memory cell. Specifically, ability evaluation and margin check for a threshold of each single bit cell are difficult in the known configuration.

In view of the above-described problems, the present invention has been devised and it is therefore an object of the present invention to make it possible to perform evaluation for each single bit cell in a semiconductor memory including a differential-type cell.

To solve the above-described problems, according to the present invention, a semiconductor memory includes: first and second bit cells configured so as to store data indicating opposite logic states to each other, respectively; a differential amplifier for receiving respective outputs of the first and second bit cells as inputs, amplifying a difference between the inputs, and outputting an amplified difference; and selection means for outputting an output of the differential amplifier as readout data in a normal operation and selectively outputting the output of the first or second bit cell, instead of the output of the differential amplifier, when a first control signal instructs to read out the output of the first bit cell or when a second control signal instructs to read out the output of the second bit cell.

According to the present invention, in a normal operation, an output of the differential amplifier for amplifying a difference between outputs of the first and second bit cells is output as readout data. When readout of an output of the first bit cell is instructed by the first control signal, the output of the first bit cell is read out. When readout of an output of the second bit cell is instructed by the second control signal, the output of the second bit cell is read out. Thus, data readout can be separately performed for the first and second bit cells. Therefore, for example, ability evaluation for a threshold of each single bit cell can be conducted in a simple manner.

Then, it is preferable that the selection means in the semiconductor memory of the present invention includes a first two-input NAND gate for receiving as inputs the output of the first bit cell and the first control signal, a second two-input NAND gate for receiving as inputs the output of the second bit cell and the second control signal, a three-input NAND gate for receiving as inputs respective outputs of the first and second two-input NAND gates and the output of the differential amplifier, and an output fixing means for fixing the output of the differential amplifier when the first or second control signal instructs to read out the output of the first or second bit cell.

Furthermore, it is preferable that the output fixing means includes an MOS transistor provided between an output line of the differential amplifier and a power supply line or a grand line and fixes the output of the differential amplifier by turning ON the MOS transistor.

Moreover, it is preferable that the semiconductor memory of the present invention further includes: an amplifier disabling means for setting the differential amplifier to be disabled when the first or second control signal instructs to read out the output of the first or second bit cell.

Moreover, it is preferable that the semiconductor memory of the present invention further includes: a readout control section for supplying a data readout current to the first and second bit cells in a readout operation and the readout control section is configured so that a setting of a load resistance in supplying the data readout current can be changed.

Thus, in a readout operation, the setting of the load resistance when a data readout current is supplied can be changed, so that a margin for a threshold of a bit cell of interest can be checked in a simple manner. Specifically, when the load resistance is set to be large, measurement for a low threshold becomes possible. On the other hand, when the load resistance is set to be small, measurement for a high threshold becomes possible.

Furthermore, is it preferable that the readout control section includes a resistance section formed of a plurality of MOS transistors, and the resistance section is configured so that the number of the MOS transistors to serve as the load resistance can be changed according to a load switching signal.

Thus, components of a circuit can be all made of MOS transistors. Therefore, fabrication processes can be simplified.

Moreover, it is preferable that in a normal operation, the load resistance in the readout control section is set to be a value between possible maximum and minimum values for the load resistance.

Moreover, it is preferable that each of the first and second bit cells in the semiconductor memory of the present invention is a non-volatile memory.

Moreover, it is preferable that each of the first and second bit cells in the semiconductor memory of the present invention includes first and second MOS transistors having a floating gate structure in which a gate is shared by the first and second MOS transistors, and the first MOS transistor has a source and a drain connected to each other and is used as a control gate.

As described above, according to the present invention, in a semiconductor memory including a so-called differential type cell, data readout can be performed for each single bit cell. Therefore, for example, ability evaluation for a threshold of each single bit cell can be conducted in a simple manner.

DESCRIPTION OF THE PREFERRED EMBODIMENTS

Hereafter, embodiments of the present invention will be described with reference to the accompanying drawings.

First Embodiment

Figure 1:
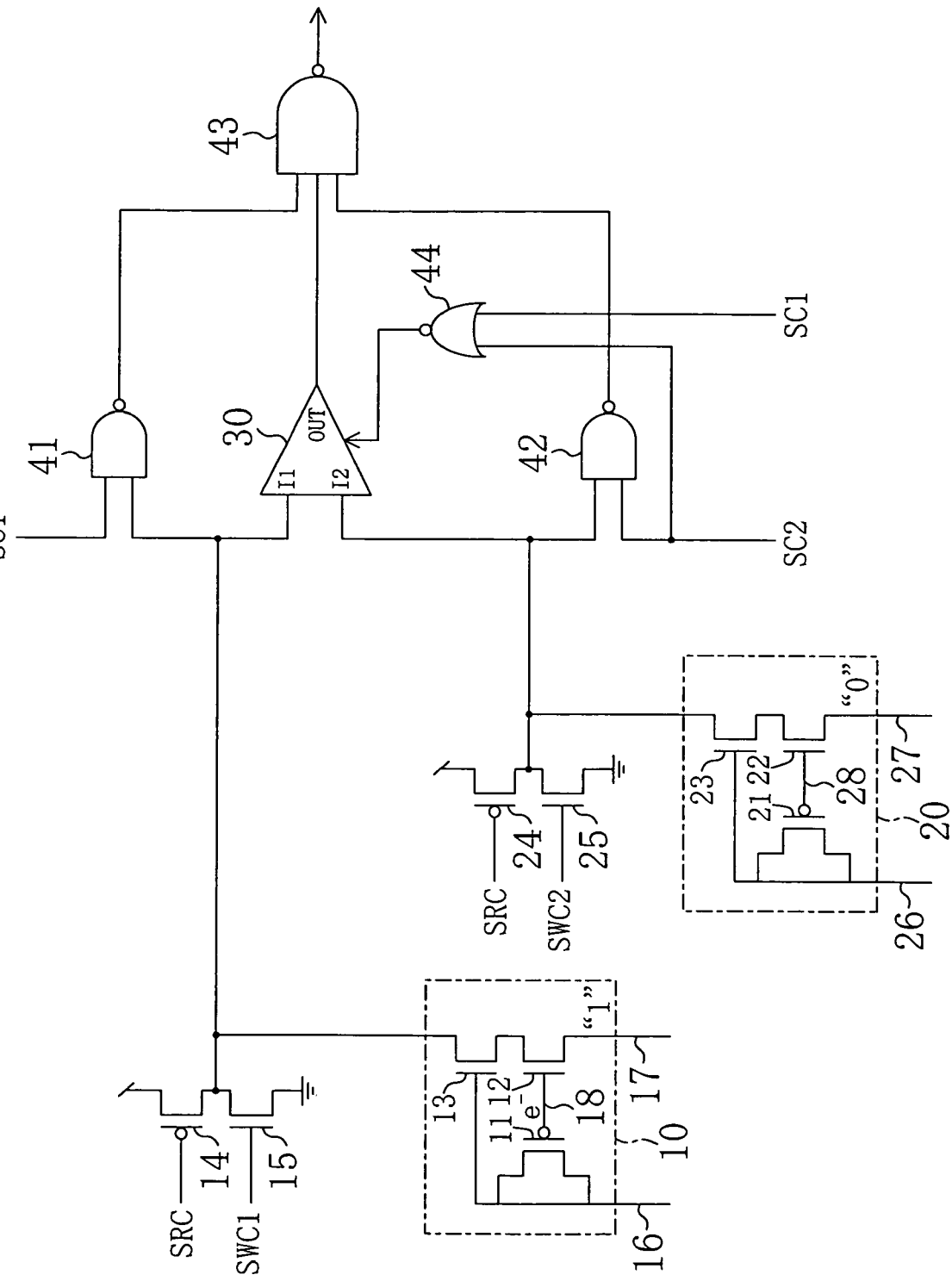
FIG. 1 is a block diagram illustrating the configuration of a semiconductor memory according to a first embodiment of the present invention.
Figure 2:
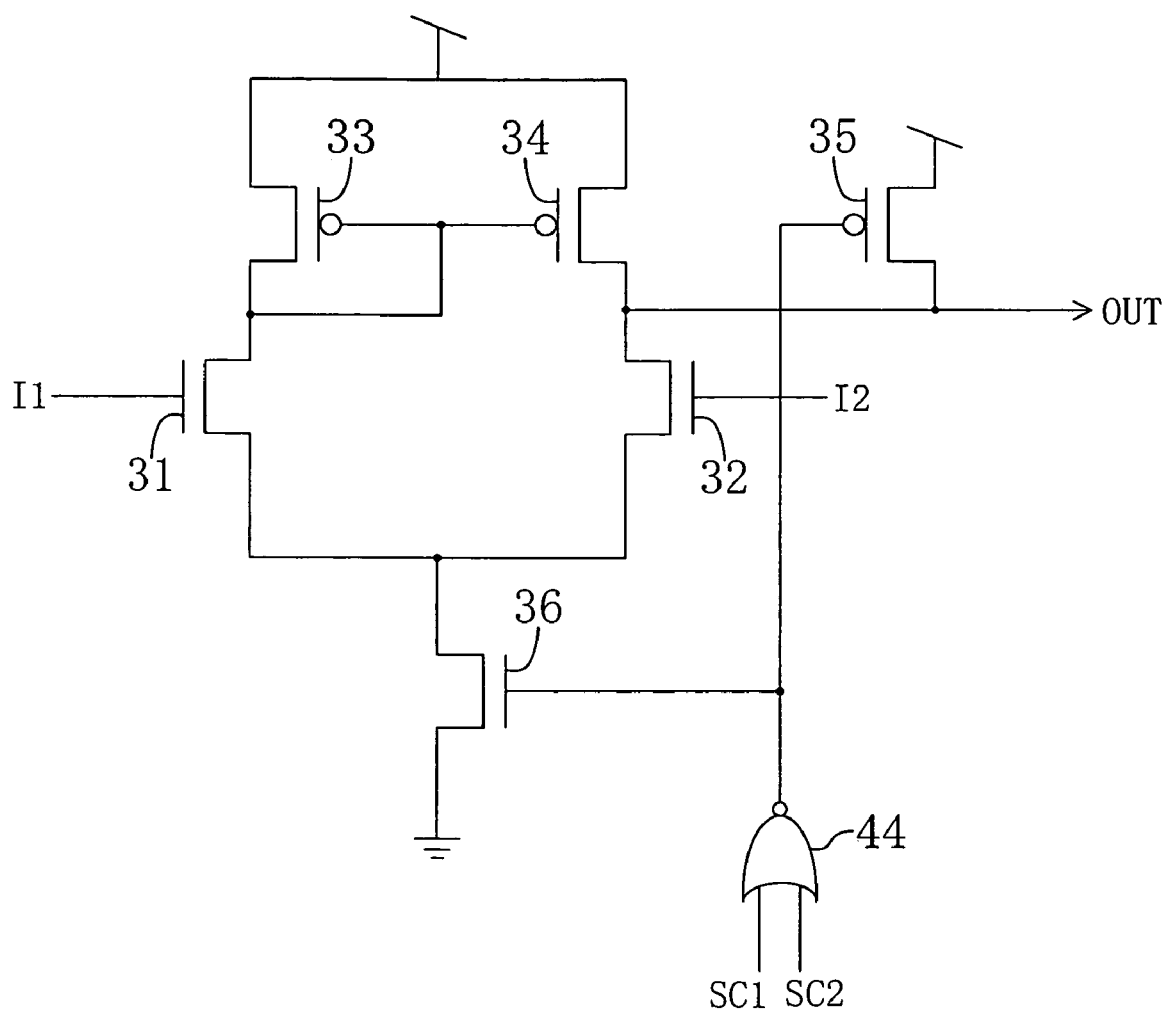
FIG. 2 is a circuit diagram of a differential amplifier in FIG. 1.

FIG. 1 is a block diagram illustrating the configuration of a semiconductor memory according to a first embodiment of the present invention. FIG. 2 is a circuit diagram illustrating an inner configuration of a differential amplifier in FIG. 1. In FIG. 1, the reference numeral 10 denotes a first bit cell and the reference numeral 20 denotes a second bit cell. The first and second bit cells 10 and 20 stores data indicating opposite logic states to each other, respectively. The reference numeral 30 denotes a differential amplifier for receiving respective outputs from the first and second bit cells 10 and 20 as inputs I1 and I2, respectively, amplifying a difference between the outputs, and outputting the difference.

In this case, each of the first and second bit cells 10 and 20 has a configuration including two MOS transistors sharing a common floating gate for storing electric charges. Specifically, the first bit cell 10 includes first and second MOS transistors 11 and 12 having a floating gate structure in which a gate is shared by the first and second MOS transistors 11 and 12. The first MOS transistor 11 has a source and a drain connected to each other and is used as a control gate 16. In the same manner, the second bit cell 20 includes first and second MOS transistors 21 and 22 having a floating gate structure in which a gate is shared by the first and second MOS transistors 21 and 22. Moreover, the reference numerals 13 and 23 denote NMOS transistors. Respective gates of the NMOS transistors 13 and 23 are connected to the control gate 16 and 26, respectively, respective sources of the NMOS transistors 13 and 23 are connected to respective drains of the second MOS transistors 12 and 22, respectively, and respective drains of the NMOS transistors 13 and 23 are connected to an input of the differential amplifier 30.

Moreover, the reference numerals 14 and 24 denote load transistors for receiving a readout control signal SRC and controlling data readout operations of the first and second bit cells 10 and 20, respectively. The reference numerals 15 and 25 denote switching transistors for receiving write control signals SWC1 and SWC2, respectively, and controlling data write operations of the first and second bit cells 10 and 20, respectively. The load transistors 14 and 24 supply current to the first and second bit cells 10 and 20, respectively, when data is read out. The switching transistors 15 and 25 perform ON/OFF control of current flowing through the first and second bit cells 10 and 20 when data is written.

The reference numeral 41 denotes a first two-input NAND gate for receiving an output of the first bit cell 10 and the first control signal SC1 as inputs, the reference numeral 42 denotes a second two-input NAND gate for receiving an output of the second bit cell 20 and the second control signal SC2 as inputs, and the reference numeral 43 denotes a three-input NAND gate for receiving outputs of the first and second two-input NAND gates 41 and 42 and an output of the differential amplifier 30 as inputs. When each of the first and second control signals SC1 and SC2 is "H", the first and second control signals SC1 and SC2 instruct to read out the outputs of the first and second bit cells 10 and 20. Moreover, the reference numeral 44 denotes a NOR gate for receiving the first and second control signals SC1 and SC2 as inputs.

In FIG. 2, NMOS transistors 31 and 32 and PMOS transistors 33 and 34 together form a major portion of the differential amplifier 30. Furthermore, a PMOS transistor 35 as an output fixing means and an NMOS transistor 36 as an amplifier disabling means are provided. The first and second two-input NAND gates 41 and 42, the three-input NAND gate 43, the NOR gate 44, and the PMOS transistor 35 as an output fixing means together form selection means according to the present invention.

The PMOS transistor 35 is provided between an output line of the differential amplifier 30 and a power supply line and receives an output of the NOR gate 44 at the gate. Specifically, at least one of the first and second control signals SC1 and SC2 is "H", the output of the NOR gate 44 becomes "L", so that the PMOS transistor 35 is turned ON. Thus, an output OUT of the differential amplifier 30 is fixed to be "H". Note that the output OUT of the differential amplifier 30 may be fixed to be "L" by providing an MOS transistor between the output line of the differential amplifier 30 and a ground line and turning ON the MOS transistor.

The NMOS transistor 36 controls a constant-current power supply of the differential amplifier 30. Specifically, when at least one of the first and second control signals SC1 and SC2 is "H", the output of the NOR gate 44 becomes "L"

and the NMOS transistor 36 is turned OFF. Thus, the differential amplifier 30 is set to be disabled.

The operation of a semiconductor memory having the configuration shown in FIGS. 1 and 2 will be described.

First, a data write operation is performed in the following manner. One of write control signals SWC1 and SWC2 is set to be "H" to turn ON either one of the switching transistors 15 and 25. In this case, the switching transistor 15 is turned ON. Then, a high voltage is applied to the control gates 16 and 26 and source lines 17 and 27.

At this point, the NMOS transistor 13 is turned ON, so that the first bit cell 10 is energized. As a result, channel hot electrons are generated and reach a floating gate 18. Due to electric charges being stored, the threshold is increased to a high level and a logic data "1" is stored.

On the other hand, the NMOS transistor 25 is not turned ON and in the second bit cell 20, channel hot electrons are not generated. Thus, electric charges are not stored in the floating gate 28, so that the threshold stays low and a logic data "0" is stored.

In a data readout operation, the readout control signal SRC is set to be "L", each of the load transistors 14 and 24 is turned ON. Moreover, the write control signals SWC1 and SWC2 are set to be "L" to turn OFF the transistors 15 and 25. As a result, a current flows in each of the first and second bit cells 10 and 20. In this case, a voltage is applied to the control gates 16 and 26 while the source lines 17 and 27 are made to be 0 V. At this point, in the first bit cell 10 in which electric charges are present in the floating gate 18, the threshold becomes low and the NMOS transistor 12 stays in an OFF state. On the other hand, in the second bit cell 20 in which electric charges are not present in the floating gate 28, a voltage of the floating gate 28 exceeds the threshold of the NMOS transistor 22, so that the NMOS transistor 22 is turned ON. Thus, a state where electric charges are present and a state where electric charges are not present are distinguished from each other, and opposite logic data are read out from the first and second bit cells 10 and 20, respectively.

Then, in a normal readout operation, each of the first and second control signals SC1 and SC2 is set to be "L". In this case, each of outputs of the first and second two-input NAND gates 41 and 42 is fixed to be "H" regardless of the outputs of the first and second bit cells 10 and 20. Moreover, the output of the NOR gate 44 becomes "H", so that the NMOS transistor 36 is turned ON. Thus, the differential amplifier 30 becomes enabled.

The differential amplifier 30 amplifies a difference between the outputs of the first and second bit cells 10 and 20 in which opposite logic data to each other are stored, respectively, and outputs the amplified difference. Since each of the outputs of the first and second two-input NAND gates 41 and 42 is "H", the three-input NAND gate 43 receives the output of the differential amplifier 30 and then outputs as readout data the output of the differential amplifier 30 as it is. That is, a data readout operation is performed in the same manner as in the known technique.

Next, an operation in a test mode will be described. In this case, a positive logic is stored in the first bit cell 10 and a negative logic is stored in the second bit cell 20. Then, to instruct to read out the output of the first bit cell 10, the first control signal SC1 is set to be "H". The second control signal SC2 is kept "L".

At this time, the first two-input NAND gate 41 outputs the output of the first bit cell 10 as it is. On the other hand, the output of the second two-input NAND gate 42 is fixed to be "H". Moreover, the output of the NOR gate 44 becomes "L" and thus the PMOS transistor 35 is turned ON and the output OUT of the differential amplifier 30 is fixed to be "H". Furthermore, the NMOS transistor 36 is turned OFF and the differential amplifier 30 becomes disabled.

Since each of the outputs of the differential amplifier 30 and the second two-input NAND gate 42 is fixed to be "H", the three-input NAND gate 43 outputs the output of the first two-input NAND gate 41, i.e., the output of the first bit cell 10 as it is. That is, data of the first bit cell 10 is read out.

In the same manner, by setting the second control signal SC2 and the first control signal SC1 to be "H" and "L", respectively, the output of the first two-input NAND gate 41 is fixed to be "H" while the output of the second bit cell 20 is output as it is from the second two-input NAND gate 42. Thus, the three-input NAND gate 43 outputs the output of the second two-input NAND gate 42, i.e., the output of the second bit cell 20 as it is. That is, data of the second bit cell 20 is read out.

As described above, according to this embodiment, data of each of the first and second bit cells 10 and 20 can be separately read out.

Note that a selection means according to the present invention is not limited to the selection means described in this embodiment, but may have various other structures. For example, a three-input selector for receiving the outputs of first and second bit cells 10 and 20 and the differential amplifier 30 as inputs may be provided.

Moreover, in a test mode, as a voltage of the control gate 16 is reduced from a high level with the source line 17 maintained at 0 V, the output of the three-input NAND gate 43 is changed from "H" to "L". The threshold of the first bit cell 10 can be determined from the voltage of the control gate 16 when the voltage change occurs.

Second Embodiment

Figure 3:
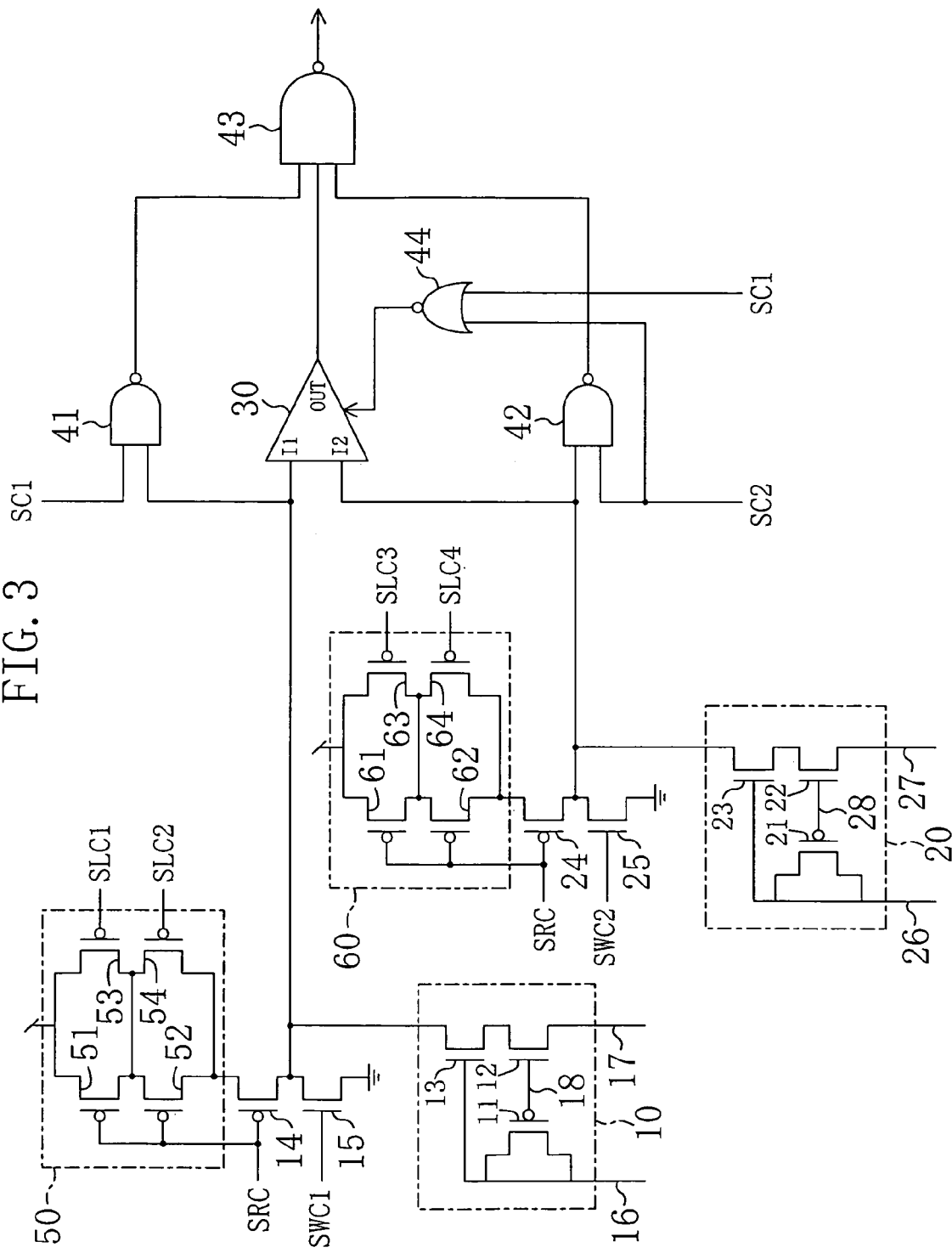
FIG. 3 is a block diagram illustrating the configuration of a semiconductor memory according to a second embodiment of the present invention.

FIG. 3 is a block diagram illustrating the configuration of a semiconductor memory according to a second embodiment of the present invention. In FIG. 3, each member also shown in FIG. 1 is identified by the same reference numeral. In FIG. 3, a first resistance section 50 including a plurality of MOS transistors 51, 52, 53 and 54 and a second resistance section 60 including a plurality of MOS transistors 61, 62, 63 and 64 are provided. The first and second resistance section 50 and 60 and the load transistors 14 and 24 together form a readout control section.

Each of the first and second resistance sections 50 and 60 is configured so that the number of MOS transistors to serve as a load resistance when a data readout current is supplied can be changed according to load switching signals SLC1, SLC2, SLC3 and SLC4. That is, the readout control section is configured so that a setting of the load resistance when a data readout current is supplied can be changed. Moreover, where respective gate lengths of the MOS transistors 51, 52, 53, 54, 61, 62, 63 and 64 are expressed by GL51, GL52, GL53, GL54, GL61, GL62, GL63 and GL64, respectively, the following relationships hold:

$GL53=GL54<GL51<GL52$ $GL63=GL64<GL61<GL62$

The operation of the semiconductor memory of FIG. 3 will be described.

In a normal readout operation, the load switching signals SLC1 and SLC2 are set to be "H" and "L", respectively. Thus, the MOS transistor 53 is turned OFF and the MOS transistor 54 is turned ON. As a result, the MOS transistors 52 and 54 are connected in parallel with each other and a load resistance in the first resistance section 50 corresponds to a resistance of a serial connection of the MOS transistor 51 and the MOS transistors 52 and 54 connected in parallel with each other. In the same manner, as for the second resistance section 60, by setting the load switching signals SLC3 and SLC4 to be "H" and "L", respectively, a load resistance of the second resistance section 60 can be made to correspond to a resistance of a serial connection of the MOS transistor 61 and the MOS transistors 62 and 64 connected in parallel with each other.

Note that in the first resistance section 50, when each of the load switching signals SLC1 and SLC2 is set to be "H", the load resistance of the first resistance section 50 corresponds to a resistance of a serial connection of the MOS transistor 51 and the MOS transistor 52, and thus a maximum load resistance can be achieved. On the other hand, when each of the load switching signals SLC1 and SLC2 is set to be "L", the load resistance corresponds to a resistance of a serial connection of the MOS transistors 51 and 53 connected in parallel with each other and the MOS transistors 52 and 54 connected in parallel with each other, and thus a minimum load resistance can be achieved. That is, according to this embodiment, in a normal operation, a load resistance in the readout control section is set to be a value between possible maximum and minimum values for the load resistance.

Other than that, the operation of the semiconductor memory is the same as that in the first embodiment.

Next, an operation in a test mode will be described. The operation in a test mode is also basically the same as that in the first embodiment. However, according to this embodiment, by changing the load resistance when a data readout current is supplied, a margin for the threshold of each of the bit cells 10 and 20 can be checked in a simple manner.

For example, when each of the load switching signals SLC1 and SLC2 is set to be "H", the load resistance in the first resistance section 50 corresponds to a resistance of a serial connection of the MOS transistors 51 and 52, and thus a maximum load resistance can be achieved. That is, with a current load kept at an increased level, readout of the first bit cell 10 can be checked. Thus, a low threshold voltage can be measured. On the other hand, if each of the load switching signals SLC1 and SLC2 is set to be "L", the load resistance in the first resistance section 50 corresponds to a resistance of a serial connection of the MOS transistors 51 and 53 connected in parallel with each other and the MOS transistors 52 and 54 connected in parallel with each other. Each of the MOS transistors 53 and 54 has a smaller gate length than those of the MOS transistors 51 and 52, and thus a minimum load resistance can be achieved. That is, with a current load kept at a reduced level, readout of the first bit cell 10 can be checked. Thus, a high threshold voltage can be measured.

As described above, according to this embodiment, a current load in a readout operation can be changed. Thus, in a test mode, a current load is increased or reduced, thereby allowing data readout for each single bit cell. Accordingly, a margin for the threshold of a bit cell can be checked in a simple manner, so that a stably operable chip can be supplied as a product.

Note that in this embodiment, a resistance section of the readout control section is formed of MOS transistors. However, the present invention is not limited thereto. By forming the resistance section of MOS transistors, components of a circuit can be all made of MOS transistors. Therefore, fabrication processes can be simplified.

Note that in the above-described embodiments, description has been given using as an example a bit cell including two MOS transistors sharing a common floating gate for storing electric charges with each other. However, the present invention is not limited thereto, but, for example, a semiconductor memory according to the present invention can be also achieved using a non-volatile bit cell having a stacked gate structure in the same manner.

In a semiconductor memory according to the present invention, two bit cells constituting a differential type cell can be separately evaluated. Therefore, a highly reliable product can be supplied.

What is claimed is:

1. A semiconductor memory comprising:
    first and second bit cells configured so as to store data indicating opposite logic states to each other, respectively;
    a differential amplifier for receiving respective outputs of the first and second bit cells as inputs, amplifying a difference between the inputs, and outputting an amplified difference; and
    selection means for outputting an output of the differential amplifier as readout data in a normal operation and selectively outputting the output of the first or second bit cell, instead of the output of the differential amplifier, when a first control signal instructs to read out the output of the first bit cell or when a second control signal instructs to read out the output of the second bit cell.

2. The semiconductor memory of claim 1, wherein the selection means includes
    a first two-input NAND gate for receiving as inputs the output of the first bit cell and the first control signal,
    a second two-input NAND gate for receiving as inputs the output of the second bit cell and the second control signal,
    a three-input NAND gate for receiving as inputs respective outputs of the first and second two-input NAND gates and the output of the differential amplifier, and
    an output fixing means for fixing the output of the differential amplifier when the first or second control signal instructs to read out the output of the first or second bit cell.

3. The semiconductor memory of claim 2, wherein the output fixing means includes an MOS transistor provided between an output line of the differential amplifier and a power supply line or a grand line and fixes the output of the differential amplifier by turning ON the MOS transistor.

4. The semiconductor memory of claim 1, further comprising:
    an amplifier disabling means for setting the differential amplifier to be disabled when the first or second control signal instructs to read out the output of the first or second bit cell.

5. The semiconductor memory of claim 1, further comprising:
    a readout control section for supplying a data readout current to the first and second bit cells in a readout operation,
    wherein the readout control section is configured so that a setting of a load resistance in supplying the data readout current can be changed.

6. The semiconductor memory of claim 5, wherein the readout control section includes a resistance section formed of a plurality of MOS transistors, and wherein the resistance section is configured so that the number of the MOS transistors to serve as the load resistance can be changed according to a load switching signal.

7. The semiconductor memory of claim 5, wherein in a normal operation, the load resistance in the readout control section is set to be a value between possible maximum and minimum values for the load resistance.

8. The semiconductor memory of claim 1, wherein each of the first and second bit cells is a non-volatile memory.

9. The semiconductor memory of claim 1, wherein each of the first and second bit cells includes first and second MOS transistors having a floating gate structure in which a gate is shared by the first and second MOS transistors, and wherein the first MOS transistor has a source and a drain connected to each other and is used as a control gate.

* * * * *